(12) United States Patent
Tkachenko et al.

(10) Patent No.: US 10,199,247 B2
(45) Date of Patent: Feb. 5, 2019

(54) DIRECTED SELF-ASSEMBLY OF ELECTRONIC COMPONENTS USING DIAMAGNETIC LEVITATION

(71) Applicant: Rensselaer Polytechnic Institute, Troy, NY (US)

(72) Inventors: Anton Tkachenko, Troy, NY (US); James Jian-qiang Lu, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 15/519,190

(22) PCT Filed: Oct. 16, 2015

(86) PCT No.: PCT/US2015/055929
§ 371 (c)(1),
(2) Date: Apr. 14, 2017

(87) PCT Pub. No.: WO2016/061452
PCT Pub. Date: Apr. 21, 2016

(65) Prior Publication Data
US 2017/0229330 A1    Aug. 10, 2017

Related U.S. Application Data

(60) Provisional application No. 62/064,629, filed on Oct. 16, 2014.

(51) Int. Cl.
| | |
|---|---|
| *H01L 21/67* | (2006.01) |
| *H02K 1/27* | (2006.01) |
| *H02N 15/00* | (2006.01) |
| *H01L 21/68* | (2006.01) |
| *H01L 21/82* | (2006.01) |

(Continued)

(52) U.S. Cl.
CPC ...... *H01L 21/67121* (2013.01); *B23P 19/033* (2013.01); *B23P 19/04* (2013.01); *B23P 19/107* (2013.01); *H01F 1/055* (2013.01); *H01F 1/057* (2013.01); *H01F 1/12* (2013.01); *H01F 7/0236* (2013.01); *H01F 7/127* (2013.01); *H01L 21/02104* (2013.01); *H01L 21/68* (2013.01); *H01L 21/82* (2013.01); *H02K 1/06* (2013.01);
(Continued)

(58) Field of Classification Search
CPC ........ H01F 7/0236; H01F 7/0247; H01F 7/12; H01F 7/127; H01L 21/02104; H01L 21/68; H01L 21/82; H02N 15/00; H02N 15/04; B23P 19/04; B23P 19/107
See application file for complete search history.

(56) References Cited

U.S. PATENT DOCUMENTS

| | | |
|---|---|---|
| 3,439,416 A | 4/1969 | Yando |
| 5,396,136 A | 3/1995 | Pelrine |

(Continued)

FOREIGN PATENT DOCUMENTS

WO    2013158949 A1    10/2013

OTHER PUBLICATIONS

International Search Report & Written Opinion for International Application No. PCT/US2015/055929 dated Jan. 11, 2016, 8 pages.

*Primary Examiner* — Mounir S Amer
(74) *Attorney, Agent, or Firm* — Murtha Cullina LLP; Anthony P. Gangemi

(57) ABSTRACT

Embodiments of the invention relate generally to directed self-assembly (DSA) and, more particularly, to the DSA of electronic components using diamagnetic levitation.

20 Claims, 10 Drawing Sheets

(51) Int. Cl.
  *B23P 19/033* (2006.01)
  *H01F 1/057* (2006.01)
  *H02K 1/06* (2006.01)
  *B23P 19/04* (2006.01)
  *B23P 19/10* (2006.01)
  *H01F 1/055* (2006.01)
  *H01F 7/02* (2006.01)
  *H01F 7/127* (2006.01)
  *H01L 21/02* (2006.01)
  *H02N 15/04* (2006.01)
  *H01F 1/12* (2006.01)

(52) U.S. Cl.
  CPC ........... *H02K 1/2753* (2013.01); *H02N 15/00* (2013.01); *H02N 15/04* (2013.01)

(56) References Cited

U.S. PATENT DOCUMENTS

2010/0170086 A1 7/2010 Ramadan et al.
2014/0123461 A1 5/2014 Whitesids et al.

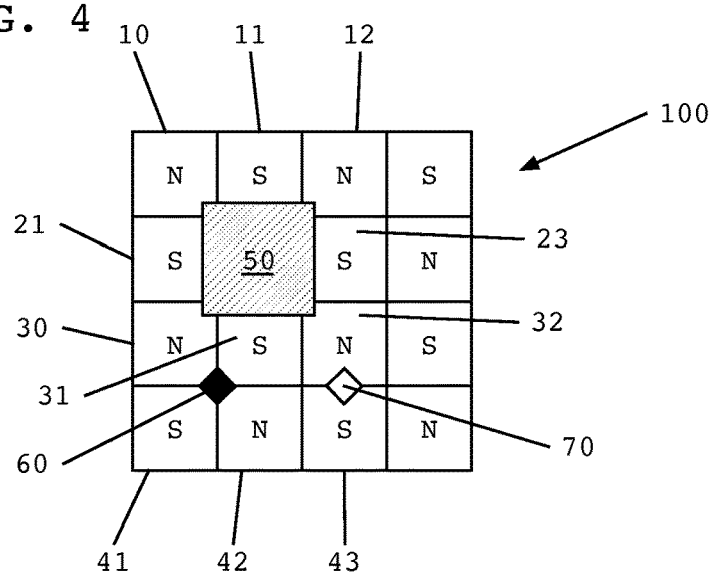
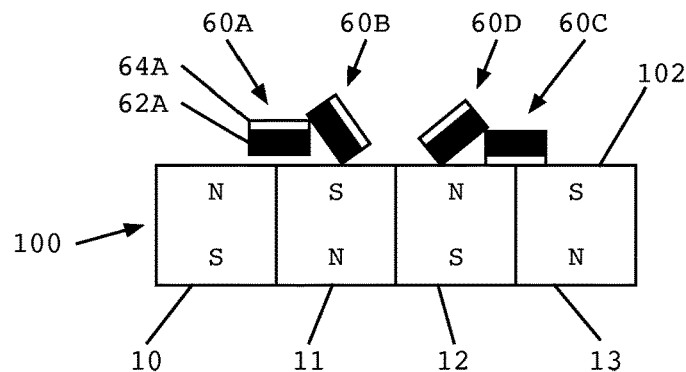
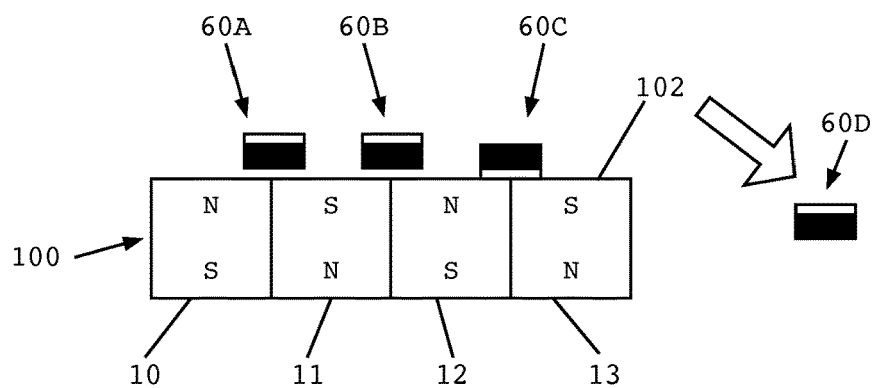

DIRECTED SELF-ASSEMBLY OF ELECTRONIC COMPONENTS USING DIAMAGNETIC LEVITATION

CROSS-REFERENCE TO RELATED APPLICATIONS

This application claims the benefit of U.S. Provisional Patent Application Ser. No. 62/064,629, filed 16 Oct. 2014, which is hereby incorporated herein as though fully set forth.

STATEMENT REGARDING FEDERALLY-SPONSORED RESEARCH OR DEVELOPMENT

This invention was made with government support under contract number EEC-0812056 awarded by National Science Foundation. The government has certain rights in the invention.

BACKGROUND

Currently, the assembly of electronic components involves the use of "pick-and-place" robots, which physically lift and move the components into a desired configuration. In some contexts, however, the use of such robots has become impossible or impractical. For example, the use of pick-and-place robots to assemble a large number of very small (e.g., mesoscopic or microscopic) components on large substrates has proven difficult, slow, and, as a consequence, very expensive. Such situations include, for example, the fabrication of large-area light emitting diode (LED) luminaires and displays, electronic skins and textiles, and photovoltaic devices.

Other approaches have attempted to solve some of these problems and include laser-assisted transfer, transfer printing, and directed self-assembly (DSA). DSA may employ the use of one or more forces, such as electrostatic force, magnetic force, or capillary force to assemble components in a parallel fashion without individually manipulating each component. DSA techniques may be carried out in air or a liquid.

Diamagnetic materials create an induced magnetic field oriented opposite to an applied magnetic field, resulting in repulsion of the diamagnetic material by the applied magnetic field. Diamagnetic materials may therefore be levitated by magnetic fields. Room temperature diamagnetic levitation has only been possible since the discovery of neodymium magnets and light, strongly diamagnetic materials, such as pyrolytic graphite (PG), sometimes referred to as pyrolytic carbon.

SUMMARY

In one embodiment, the invention provides a method of assembling a plurality of diamagnetic components, the method comprising: depositing a plurality of diamagnetic components onto a magnetic stage, the magnetic stage comprising a plurality of magnets arranged in an array; and applying a vibratory force to the magnetic stage, wherein, applying the vibratory force moves at least one of the plurality of diamagnetic components to a stable levitation node of the magnetic stage.

In another embodiment, the invention provides a system for directed self-assembly of diamagnetic components, the system comprising: a magnetic stage comprising a plurality of magnetic devices arranged in an array with alternating and opposite magnetic orientations; and at least one device operable to deliver at least a first vibratory force to the magnetic stage.

BRIEF DESCRIPTION OF THE DRAWINGS

These and other features of the invention will be more readily understood from the following detailed description of the various aspects of the invention taken in conjunction with the accompanying drawings, which depict various embodiments and aspects of the invention, in in which:

FIG. 4 shows a schematic top view of various diamagnetic components occupying stable levitation nodes of the magnetic stage of FIG. 1;

FIGS. 5 and 6 show schematic side views of a portion of the magnetic stage of FIG. 1 in conjunction with a plurality of diamagnetic components;

It is noted that the drawings are not to scale and are intended to depict only typical aspects of the invention. The drawings should not, therefore, be considered as limiting the scope of the invention. Where possible, like numbering represents like elements between and among the drawings.

DETAILED DESCRIPTION

Figure 1:
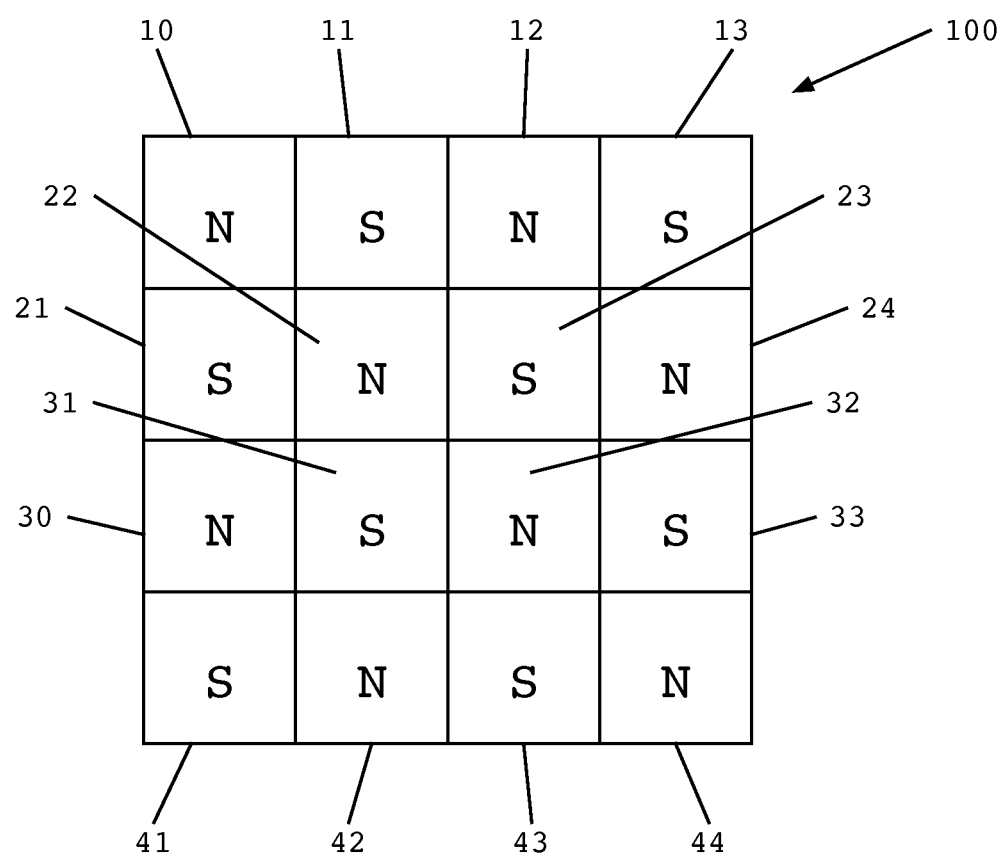
FIG. 1 shows a schematic top view of a magnetic stage according to an embodiment of the invention.

Referring now to the drawings, FIG. 1 shows a schematic top view of a magnetic stage 100 suitable for use in accordance with various embodiments of the invention. Magnetic stage 100 comprises a plurality of magnets arranged in rows and columns with alternating poles facing upward, resembling a checkerboard pattern. That is, a first row of magnets includes "north up" magnets 10 and 12, alternating with "south up" magnets 11 and 13, while a second row of magnets includes "south up" magnets 21 and 23 alternating with "north up" magnets 22 and 24. The third and fourth rows of magnets repeat this pattern, such that each magnetic pole on a surface of magnetic stage 100 is abutted above, below, and on each lateral side by an opposite pole and abutted diagonally by a similar pole.

As shown in FIG. 1, magnetic stage 100 comprises a "four-by-four" square. One skilled in the art will appreciate, however, that magnetic stage 100 may be smaller or larger than as depicted in FIG. 1, which is provided merely for purposes of illustration.

The magnets employed in magnetic stage are typically rare earth magnets, i.e., neodymium magnets or samarium-cobalt magnets. In the various embodiments of the invention described herein, magnetic stage 100 is comprised of 6.35 mm cubic NdFeB magnets, although the principles of the invention are applicable to the use of magnets of different sizes and compositions.

Similarly, although depicted in FIG. 1 and described throughout the specification as a checkerboard pattern, other arrangements of magnetic stage 100 are possible, including, for example, arrangement of a plurality of magnets in a two-dimensional Halbach array. Still other arrangements will be apparent to one skilled in the art.

Figure 2:
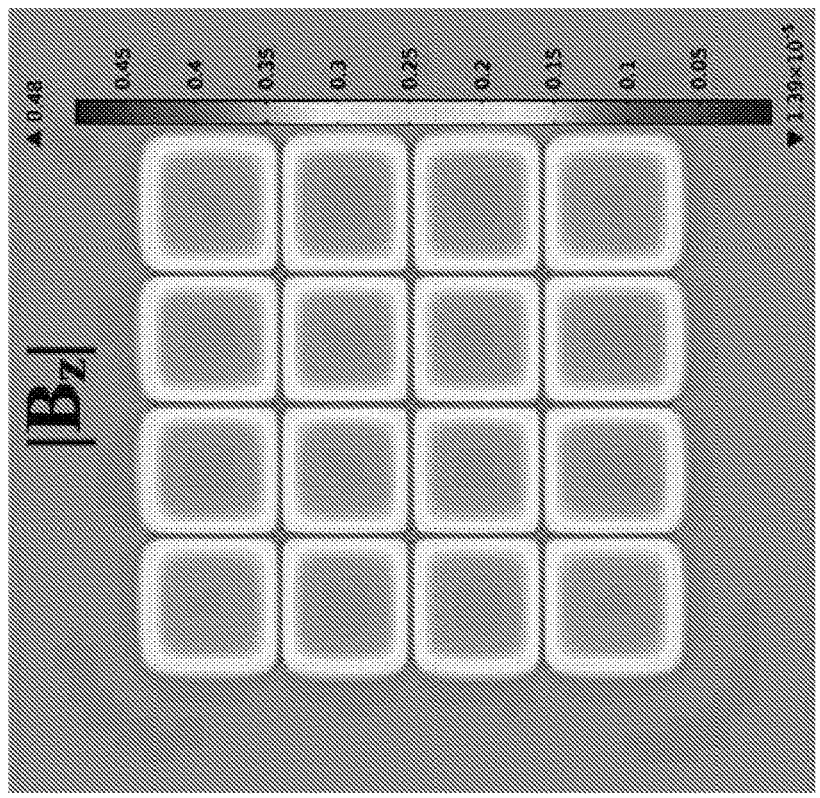
FIGS. 2 and 3 show images of the total magnetic field and vertical magnetic field of the magnetic stage of FIG. 1.

FIG. 2 shows an image of the total magnetic field (|B|) produced by magnetic stage 100 measured 0.5 mm above the stage surface. As can be seen in FIG. 2, the total magnetic field is strongest along the edges of abutting magnets and weakest at the junction of four adjacent magnets.

Figure 3:
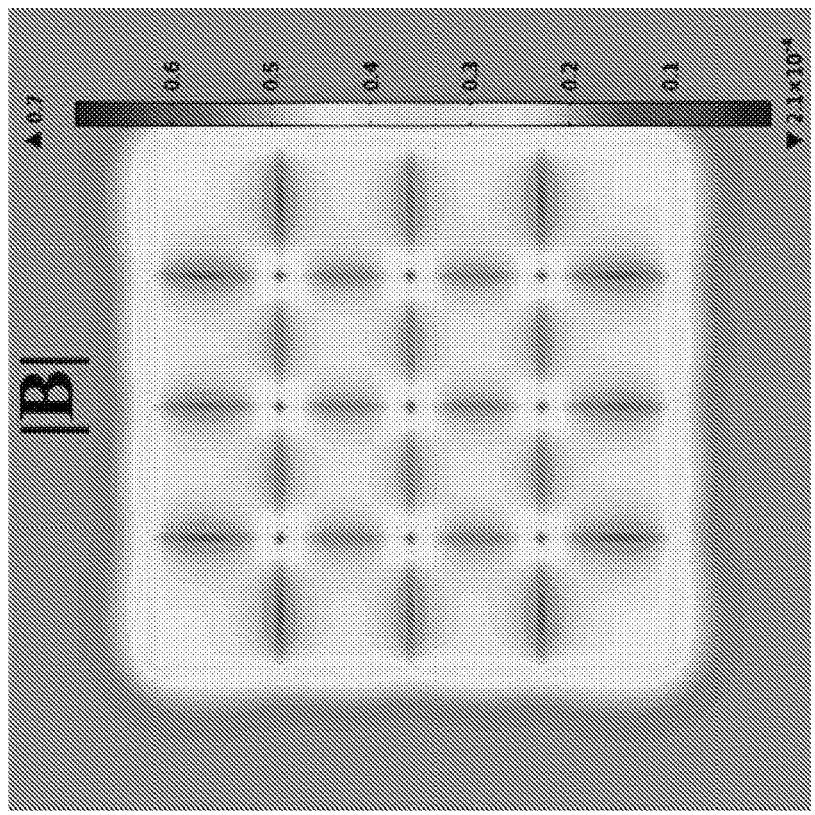

FIG. 3 shows an image of the vertical component of the total magnetic field ($|B_z|$) produced by magnetic stage 100 measured 0.5 mm above the stage surface. As can be seen in FIG. 3, the vertical component of the total magnetic field is substantially the same (and very low) both along the edges of abutting magnets and at the junction of four adjacent magnets, areas where the total magnetic field differs greatly. This creates a number of nodes at which levitation of a diamagnetic material is substantially stable. Accordingly, as used herein, such nodes are referred to as stable levitation nodes.

FIG. 4 shows a schematic view of various diamagnetic components occupying stable levitation nodes of the magnetic stage of FIG. 1. Large component 50 comprises an unpackaged Si die (6.5 mm×6.5 mm×0.15 mm) bonded to a PG sheet having a thickness between 300 µm and 1000 µm.

For square components such as large component 50, the locations of these stable levitation nodes is determined by the ratio between the lateral die size ($L_{die}$) and the lateral magnet size ($L_{mag}$), as well as the magnetic properties of the die. In FIG. 4, large component has a $L_{mag}/L_{die}$ ratio of approximately 0.8 and its stable levitation node is centered substantially atop "north up" magnet 22 (FIG. 1; obscured in FIG. 4) and extending along portions of magnets 10, 11, 12, 21, 23, 30, 31, and 32. This orientation of large component 50 minimizes the potential energy and yields the most stable levitation of large component 50. For a given $L_{mag}/L_{die}$ ratio, these stable levitation nodes will form a two-dimensional square lattice atop magnetic stage 100.

In contrast, small component 60 comprises an unpackaged Si die (1.6 mm×1.6 mm×0.15 mm) bonded to a PG sheet having a thickness between 300 µm and 1000 µm. The $L_{mag}/L_{die}$ ratio of small component 60 is approximately 3 and its stable levitation node is centered at the junction of the corners of magnets 30, 21, 41, and 42, where the total magnetic field (|B|) is weakest and the vertical component of the total magnetic field ($|B_z|$) is low. Again, for a given $L_{mag}/L_{die}$ ratio, the stable levitation nodes for small component 60 will form a two-dimensional square lattice atop magnetic stage 100.

In addition, it can be seen that, as compared to large component 50, small component 60 is angled approximately 45 degrees with respect to magnetic stage 100. In this orientation, the diagonal axes of small component 60 are aligned with the abutting faces of adjacent magnets 30, 31, 41, and 42, where the total magnetic field (|B|) is strongest. This orientation exposes the small component 60 to a minimum vertical magnetic field.

Still referring to FIG. 4, third component 70 comprises a 1.44 mm square LED die with a thin ferromagnetic layer bonded to a PG layer. The presence of the thin ferromagnetic layer shifts the stable levitation node of third component 70 laterally, such that it is centered along the edge between magnets 32 and 43. This is attributable to the combination of a strong total magnetic field and a weak vertical field at this location.

FIG. 5 shows a side schematic view of a portion of magnetic stage 100 in conjunction with a plurality of diamagnetic components 60A, 60B, 60C, 60D. Each diamagnetic component comprises a layer of a diamagnetic material (e.g., 62A) bonded to a layer of a non-diamagnetic material (e.g., 64A). The particular diamagnetic materials and non-diamagnetic materials will vary, of course, depending upon the particular application to which an embodiment of the invention is applied.

Exemplary diamagnetic materials include pyrolytic graphite (PG), bismuth, mercury, and silver. One skilled in the art will recognize, of course, that any material having a magnetic susceptibility ($\chi_v$) less than zero is considered diamagnetic and could be employed in practicing embodiments of the invention.

The layer of non-diamagnetic material may include or comprise virtually any material not recognized as diamagnetic or recognized as only weakly diamagnetic. Again, the particular material or materials employed will vary depending on the application. Materials commonly employed in the manufacture or assembly of electronic devices and which may be included in the layer of non-diamagnetic material include semiconductor materials, such as silicon, germanium, silicon carbide, boron nitride, aluminum nitride, gallium nitride, gallium selenide, indium arsenide, cadmium selenide, zinc selenide, aluminum gallium arsenide, aluminum gallium nitride, and indium gallium nitride. Other suitable materials will be apparent to one skilled in the art.

As noted above, the diamagnetic components described herein in conjunction with the various embodiments of the invention include Si dies bonded to PG sheets.

The arrangement of diamagnetic components 60A, 60B, 60C, 60D in FIG. 5 is as they may be upon their initial deposition onto magnetic stage 100. As will be made clear below, it is generally preferable, in most instances, that the number of diamagnetic components initially deposited onto the magnetic stage be greater than the number of stable levitation nodes for those diamagnetic components on the magnetic stage.

As can be seen, diamagnetic component 60A is levitated above a surface 102 of magnetic stage 100 and positioned substantially above the point at which magnet 10 and magnet 11 abut.

Diamagnetic component 60C is positioned similarly (i.e., substantially at the point at which magnet 12 and magnet 13 abut), but is vertically oriented opposite diamagnetic component 60A. That is, diamagnetic component 60C is oriented such that its diamagnetic layer is facing up and its non-diamagnetic layer is facing down.

In such a vertical orientation, the diamagnetic layer of diamagnetic component 60C is levitated above surface 102 of magnetic stage 100 to a height substantially the same as that of diamagnetic component 60A. However, in this vertical orientation, the non-diamagnetic layer of diamagnetic component 60C is either touching or levitated only slightly above surface 102. As a consequence, and as will be described in greater detail below, Applicants have found it possible to "correct" such vertical orientations such that all diamagnetic components adopt a vertical orientation with the diamagnetic layer of each component disposed between its non-diamagnetic layer and surface 102.

While the $L_{mag}/L_{die}$ ratio affects the location of the stable levitation nodes, as described above, it also affects the strength of those nodes (i.e., the efficiency of the node to act as a "magnetic trap" for diamagnetic components), with a larger (e.g., greater than 1.0) $L_{mag}/L_{die}$ ratio indicative of a stronger node. Because the $L_{mag}/L_{die}$ ratio is particular to a die of a particular size, the $L_{mag}/L_{die}$ ratio itself ensures that the stable levitation node is capable of trapping only one die of that particular size with maximum strength. That is, in the case that more than one die is present at a node, such as shown in FIG. 5, the magnetic trapping is weaker for those dies not centered at the node. Accordingly, the application of a vibratory force of proper strength will dislodge such additional dies from the node. These additional dies will then either be fully trapped in another stable levitation node or will eventually be vibrated to an edge of and from the magnetic stage.

The proper vibratory force will depend, of course, on the size and composition of the diamagnetic components, as well as the size and strength of the magnetic stage, as these same factors affect the $L_{mag}/L_{die}$ ratio and the strength of the stable levitation nodes.

As will be apparent to one skilled in the art, any number of devices may be employed to impart a vibratory force to the magnetic stage. Such devices include, for example, piezoelectric, electrodynamic, or pneumatic devices. Other devices are also possible and are intended to fall within the scope of the invention.

FIG. 6 shows a schematic side view of magnetic stage 100 and diamagnetic components 60A, 60B, 60C, 60D following application of such a vibratory force to magnetic stage 100. As can be seen, diamagnetic components 60A, 60B, and 60C have taken positions at the intersections of adjacent magnets (i.e., stable levitation nodes described above with reference to FIG. 4), while diamagnetic component 60D has been vibrated from surface 102 of magnetic stage 100 by the vibratory force.

Diamagnetic component 60C, it should be noted, is "inverted" at this point. That is, the diamagentic layer is above the non-diamagnetic layer. As a consequence, the non-diamagnetic layer is in contact with or levitated only slightly above surface 102 of magnetic stage 100. In fact, once a vibratory force is applied for a period sufficient to sort the diamagnetic components into the two-dimensional square lattice of stable levitation nodes, the vertical orientation of the diamagnetic components will be random.

Figure 7:
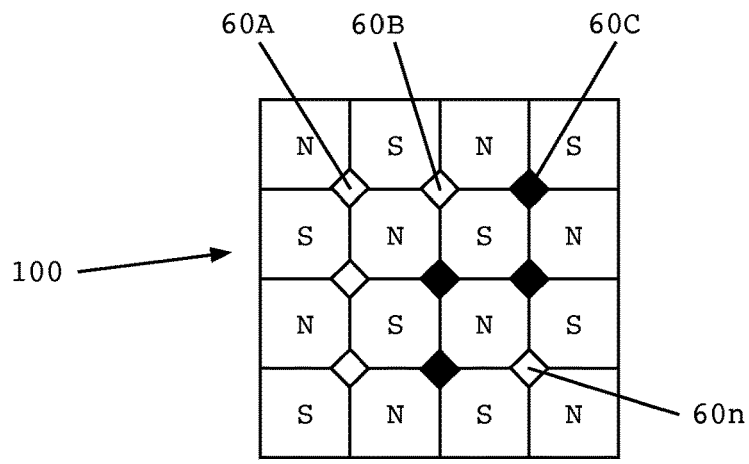
FIG. 7 shows a schematic top view of the magnetic stage of FIG. 1 in conjunction with a plurality of diamagnetic components, each occupying a stable levitation node of the magnetic stage.

FIG. 7 shows a schematic top view of such a random sorting of diamagnetic components 60A, 60B, 60C . . . 60n atop magnetic stage 100, where white diamagnetic components indicate the desired "die up" orientation and shaded diamagnetic components indicate the undesired "inverted" orientation with the diamagnetic layer above the non-diamagnetic layer.

Applicants have discovered that it is possible to correct such "inverted" orientations without either inverting already properly oriented diamagnetic components or dislodging the diamagnetic components from their stable levitation nodes. This is accomplished using a second vibratory force comprising a series of short vibration pulses separated by longer pauses. The fact that "inverted" diamagnetic components are either in contact with surface 102 or much nearer surface 102 than are properly oriented diamagnetic components means that this second vibratory force can be imparted to change the vertical orientation of "inverted" diamagnetic components but not the vertical orientation of properly oriented diamagnetic components.

As should be apparent, the strength and duration of these pulses and the length of the longer pauses making up the second vibratory force, will depend upon the size of the diamagnetic component and the $L_{mag}/L_{die}$ ratio. Short pulse duration limits the maximum distance that a diamagnetic component can travel during each pulse. As long as the distance the diamagnetic component can travel during a single pulse is less than half of the lateral magnet size, $L_{mag}$, the diamagnetic component will return to its node. In addition, the length of the longer pauses between these pulses must be sufficient to allow the diamagnetic components to adopt a vertical orientation (whether correct or inverted) before application of a subsequent pulse.

In the studies conducted by Applicants, each pulse lasted 70 ms and contained several periods of a sine wave with a period $T_1$ of 7.7 ms and an amplitude larger than the levitation height of the components, separated by a longer pause of duration $T_p$ of 550 ms. Such a second vibratory force was found sufficient to properly orient diamagnetic components such as diamagnetic component 60 described above with respect to FIG. 4.

It should be pointed out, of course, that upon application of this second vibratory force, an "inverted" diamagnetic component may flip vertically by 180 degrees or by 360 degrees. Applicants have found that either case occurs with about equal frequency. In the case of a 180 degree flip, the diamagnetic component will be in a proper orientation, the height of its levitation above surface 102 will increase, and its vertical orientation will no longer be affected by the second vibratory force. In the case of a 360 degree flip, the diamagnetic component will again be in an "inverted" orientation.

In practice, it may be impractical or impossible to actually determine whether all of the diamagnetic components have adopted a proper vertical orientation. However, it is a trivial matter to determine the number of pulses needed to be sure, with a specified level of confidence, that such orientation has been achieved. For example, Applicants determined that, for a system employing 4000 dies substantially similar to diamagnetic component 60 (FIG. 4), it would require at most 19 pulses such as those described above to be 99% certain that all 4000 dies had adopted the desired orientation, even assuming that all 4000 dies had initially had an "inverted" vertical orientation.

Figure 8:
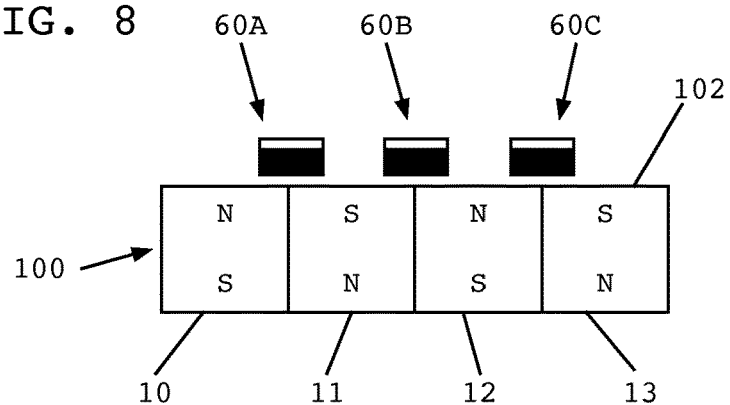
FIG. 8 shows a side schematic view of a portion of the magnetic stage of FIG. 1 in conjunction with a plurality of diamagnetic components following vertical self-alignment of the diamagnetic components.

FIG. 8 shows a side schematic view of magnetic stage 100 and diamagnetic components 60A, 60B, 60C following application of a second vibratory force such as that described above. As can be seen, diamagnetic component 60C has now adopted an orientation in which its diamagnetic layer is disposed between surface 102 and its non-diamagnetic layer and is levitating above surface 102, similar to diamagnetic components 60A and 60B.

Figure 9:
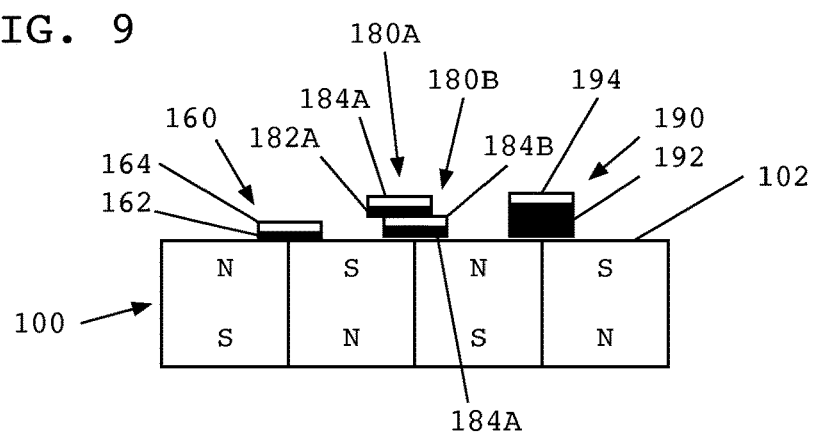
FIG. 9 shows a side schematic view of a portion of the magnetic stage of FIG. 1 in conjunction with diamagnetic components having layers of a diamagnetic material of differing thicknesses.

The self-assembly of diamagnetic components into a two-dimensional lattice, as described above, can be significantly affected by the type and thickness of the diamagnetic layer of the diamagnetic components. FIG. 9 shows a side schematic view of magnetic stage 100 in conjunction with various diamagnetic components exhibiting undesirable qualities.

For example, diamagnetic component 160 has a relatively thin diamagnetic layer 162 as compared to its non-diamagnetic layer 164. As a result, diamagnetic layer 162 provides insufficient magnetic lift to levitate both itself and non-diamagnetic layer 164 and diamagnetic component 160 either contacts or is levitated only slightly above surface 102. As noted above, the application of a second vibratory force, intended to properly orient "inverted" diamagnetic components, would, as a consequence, be imparted to diamagnetic component 160, resulting in its random flipping between proper and "inverted" orientations. In practice, this would make it impossible to ensure, with any reasonable degree of confidence, that each such diamagnetic component had assumed a proper or "non-inverted" vertical orientation. Applicants have found that for a diamagnetic component comprising a 150-200 μm thick semiconductor die as the non-diamagnetic component and PG as the diamagnetic material, PG layers having thicknesses of about 350 μm are prone to such a problem.

Diamagnetic components having slightly thicker PG layers, however, are prone to other problems. For example, diamagnetic components 180A and 180B have non-diamagnetic layers 184A, 184B of the same thickness as diamagnetic component 160, but slightly thicker diamagnetic layers 182A, 182B (e.g., a PG layer about 400 μm thick). These diamagnetic components 180A, 180B levitate high enough from surface 102 to avoid the unintended inversion to which diamagnetic component 160 is prone, but are themselves prone to vertical stacking, as shown in FIG. 9. Such vertical stacking can impede or prevent the ability of the first vibratory force to dislodge all but one diamagnetic component from each stable levitation node, since both diamagnetic components are closely centered within the node. Ultimately, this may prevent assembly of the diamagnetic components into the two-dimensional lattice above magnetic stage 100.

Still referring to FIG. 9, diamagnetic component 190 is shown having an even thicker diamagnetic layer 192 (e.g., a PG layer of between 700 μm and 1000 μm). Here, the levitation height above surface 102 is decreased because the upper portion of diamagnetic layer 192 generates less lift, a consequence of the magnetic field dropping faster with increasing height. That is, the lift-to-weight ratio of diamagnetic layer 192 is decreased, as compared to thinner diamagnetic layers of the same material.

Diamagnetic components with very thick diamagnetic layers, such as diamagnetic component 190 may levitate so close to surface 102 that application of the secondary vibratory force described above results in diamagnetic component 190 flipping its vertical orientation regardless of whether its original orientation was proper or "inverted." As such, such diamagnetic components may be subject to the same deficiencies as those with very thin diamagnetic layers, such as diamagnetic component 160.

In addition, however, diamagnetic components with very thick diamagnetic layers may also be subject to flipping 90 degrees or 270 degrees when subjected to either the first or second vibratory force. This creates an additional problem, since the diamagnetic layer would no longer experience a strong magnetic lift force, causing the diamagnetic component to move across surface 102 (whether from node to node or otherwise) at a much slower pace.

The problem is exacerbated when such a diamagnetic component reaches an edge region between two adjacent magnets and encounters a strong lateral magnetic field. If the c-axis of the diamagnetic component is perpendicular to the edge region, a strong repulsive force will be exerted, preventing the diamagnetic component from crossing the edge region. Eventually, this strong repulsive force will, in combination with the first vibratory force, cause the diamagnetic component to adopt an orientation with its c-axis oriented substantially parallel to the edge region. In this orientation, no strong magnetic force acts on the diamagnetic component and it can cross the edge region. In effect, however, each magnet of the magnetic stage acts as a cage for any diamagnetic component with its c-axis oriented perpendicular to the magnet's edge. This can greatly slow the assembly of diamagnetic components into the two-dimensional lattice above the magnetic stage, making the use of thick (e.g., greater than 700 μm) diamagnetic layers impractical.

Applicants have found, therefore, that where the diamagnetic layer comprises PG and the non-diamagnetic layer includes a semiconductor die between 150 μm and 200 μm thick, diamagnetic layer thicknesses between 500 μm and 700 μm provide the optimal levitation for directed self-assembly according to embodiments of the invention. One skilled in the art will recognize, of course, that this range may be higher, lower, broader, or narrower where the materials comprising the diamagnetic layer and/or the non-diamagnetic layer are different.

Once a plurality of diamagnetic components are arranged in the two-dimensional lattice above the magnetic stage, the final step in the self-assembly process of the invention is transfer of some or all of the arranged diamagnetic components to a substrate to which the component of the non-diamagnetic layer may be connected.

As will be apparent from the foregoing, where the magnetic stage is composed of magnets having square faces along the magnetic stage surface, the two-dimensional lattice will itself be square and have four-fold rotational symmetry. Most electronic components requiring high-speed, low-cost assembly on large substrates (e.g., LEDs) have either two- or four-fold rotational symmetry or can be designed so. Complex electronic components, such as integrated circuits, can include an orientation circuit allowing them to function regardless of the lateral orientation. As such, it may be desirable in many cases to transfer all of the diamagnetic components arranged according to the invention to a substrate.

In other cases, and as will be described in greater detail below, fewer than all of the arranged diamagnetic components may be so transferred. It will, in most such cases, be more efficient to fill each node of the two-dimensional lattice with a diamagnetic component and then selectively transfer only some of the arranged diamagnetic components to a substrate.

The transfer of diamagnetic components arranged according to the invention is carried out while the diamagnetic components are levitated above the magnetic stage. As should be apparent from the foregoing, this can be achieved in either of two ways. A substrate may be lowered from above onto the plurality of diamagnetic components, contacting the non-diamagnetic layer of each diamagnetic component arranged in a "proper" vertical orientation. Or a substrate may be raised from between the magnetic stage and the levitating diamagnetic components, thereby contacting the diamagnetic layer of each diamagnetic component arranged in such a "proper" vertical orientation.

In general, the first, "top down" method is preferred, since the substrate will typically be connected to the non-diamagnetic layer of each diamagnetic device. Use of the second, "bottom up" method requires an additional step, whereby the diamagnetic components are then transferred to a second substrate placed in contact with the non-diamagnetic layers of the diamagnetic devices.

In either case, the substrate applied to the non-diamagnetic layer may include, for example, flexible (e.g. polyimide or polyester) or rigid (e.g. FR4) base with conductive (e.g. copper, conductive ink) traces, pre-applied solder paste and other additional layers (e.g. solder mask) as needed. Other materials are possible, of course, as will be apparent to one skilled in the art.

Transfer of diamagnetic components to a substrate (either the first or second substrate) may be achieved through the application of capillary force to bond, at least temporarily, the diamagnetic components to the substrate. For example, according to the "top down" transfer method, a substrate of, for example, polyimide, may be coated or have applied to it a residue-free liquid. Suitable residue-free liquids include, for example, isopropyl alcohol or methanol. Use of a residue-free liquid is particularly important in the "top down" transfer method and the second step of the "bottom up" transfer method, as it allows for the formation of permanent solder interconnects between the non-diamagnetic component and the substrate. Where all of the diamagnetic components arranged in the lattice are to be transferred to the substrate, the entire surface of the substrate may be coated with the residue-free liquid. Where fewer than all diamagnetic components are to be transferred, an array of droplets of the residue-free liquid may be applied to the substrate corresponding to the diamagnetic components to be transferred. Such an array may be applied by any number of methods or techniques, including, for example, hydrophilic/hydrophobic patterning, stencil printing, or inkjet printing.

Once the residue-free liquid is applied to the substrate, the surface containing the residue-free liquid is lowered onto the levitating diamagnetic components and the capillary force of the liquid attaches the non-diamagnetic layer of the diamagnetic components to the substrate surface. Proper positioning of the substrate prior to making contact with the diamagnetic components may be determined by aligning the substrate according to a measured or determined magnetic force of the magnetic stage.

As noted above, once the diamagnetic components are transferred to the substrate surface, permanent solder connections may be made using, for example, a solder reflow step. Other techniques will be apparent to one skilled in the art, depending on the context in which the described method is carried out.

Finally, the diamagnetic layer of each diamagnetic component transferred and/or connected to the substrate may be removed by, for example, dissolving the adhesive or agent used to bond the diamagnetic layer and the non-diamagnetic layer, leaving only the non-diamagnetic layer transferred and/or bound to the substrate.

Figure 10:
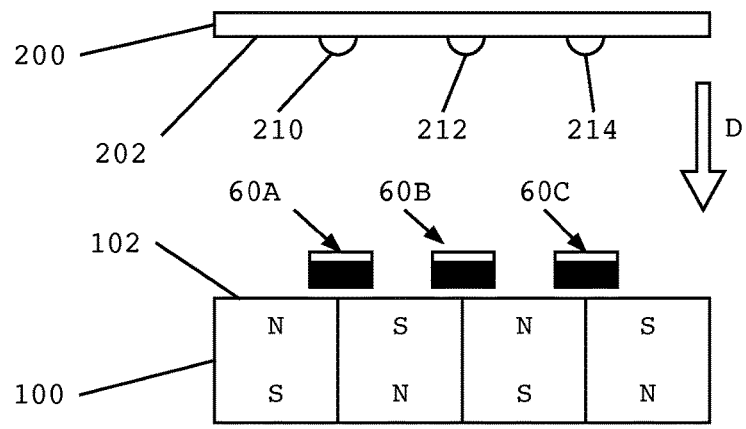
FIGS. 10 and 11 show side schematic views of steps involved in one method of transferring a plurality of diamagnetic components to a substrate.
Figure 11:
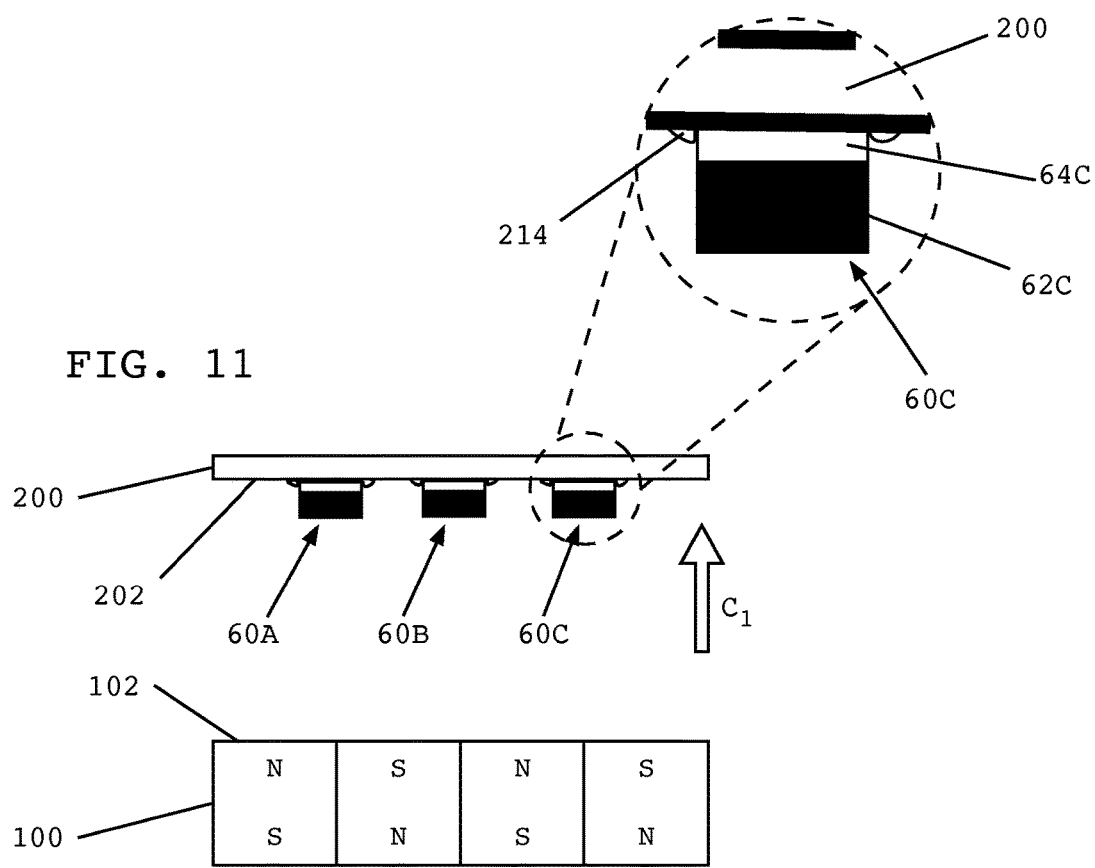

FIGS. 10 and 11 show side schematic views of the "top down" transfer method described above. As can be seen in FIG. 10, a substrate 200 with a plurality of droplets 210, 212, 214 disposed along its bottom surface 202 is positioned above diamagnetic components 60A, 60B, 60C, which are levitating above surface 102 of magnetic stage 100. As noted above, substrate 200 may be positioned according to the magnetic field of magnetic stage 100 in order to ensure that droplets 210, 212, 214 are aligned with and will contact diamagnetic components 60A, 60B, 60C, respectively, when substrate 200 is lowered.

In FIG. 11, substrate 200 has been lowered along path D (FIG. 10) toward magnetic stage 100 and diamagnetic components 60A, 60B, 60C have been become adhered to surface 202 of substrate 200 by virtue of the capillary force $C_1$ of droplets 210, 212, 214, respectively. The inset detailed view of diamagnetic component 60C shows the interaction of non-diamagnetic layer 64C, droplet 214 and substrate 200.

As noted above, diamagnetic components 60A, 60B, 60C may then be connected to substrate 200 by a permanent solder interconnect using, for example, a solder reflow process. As also noted above, the diamagnetic layers of diamagnetic components 60A, 60B, 60C may be removed by dissolving the adhesive originally used to join the diamagnetic layers and the non-diamagnetic layers.

Figure 12:
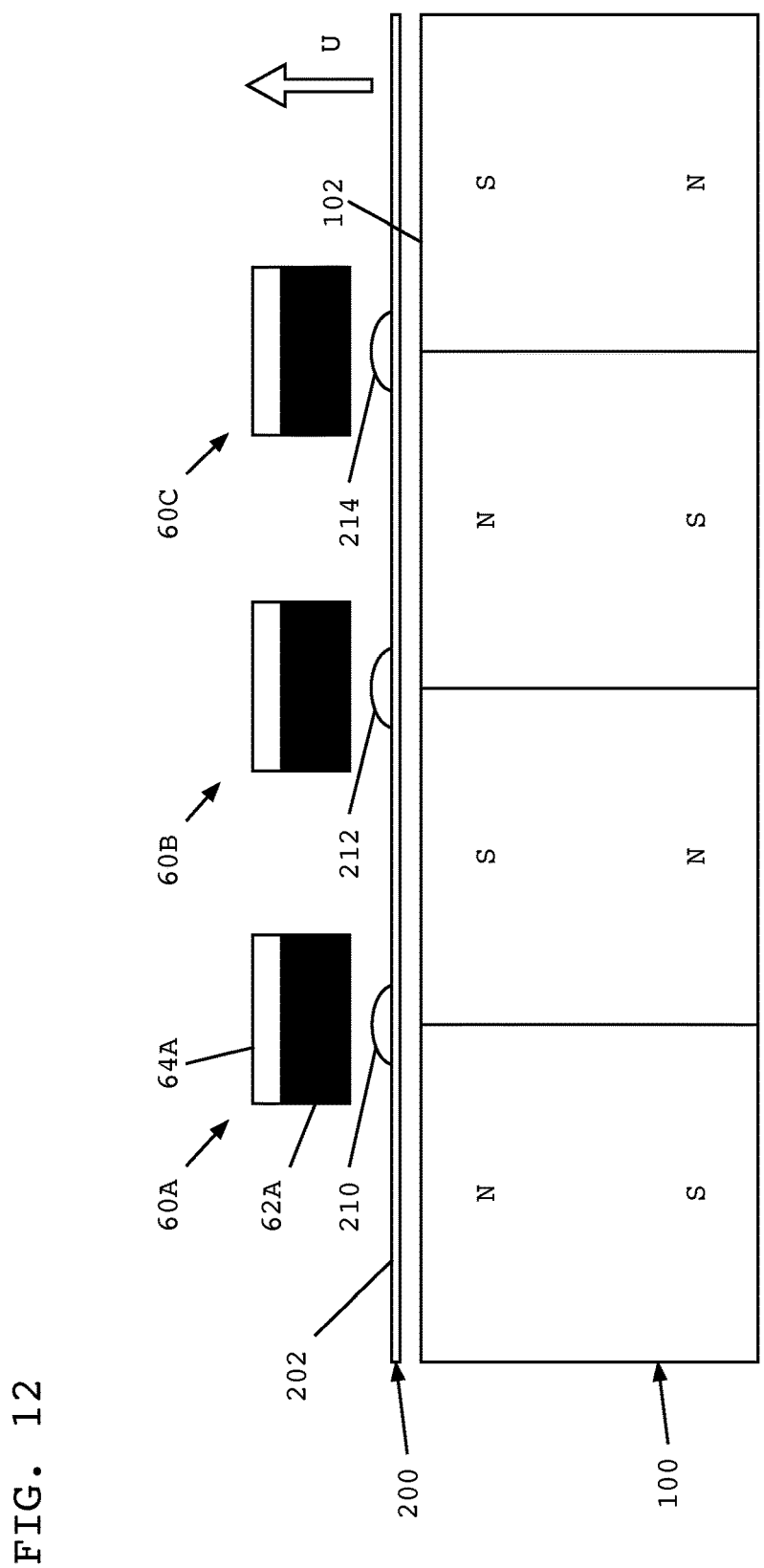
FIGS. 12-14 show side schematic views of steps involved in another method of transferring a plurality of diamagnetic components to a substrate.
Figure 13:
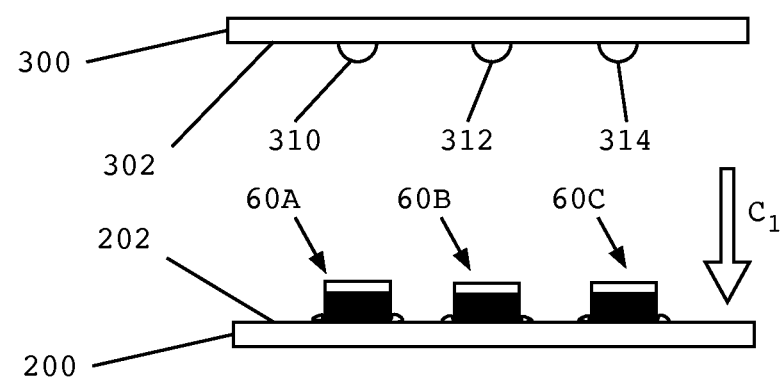
Figure 14:
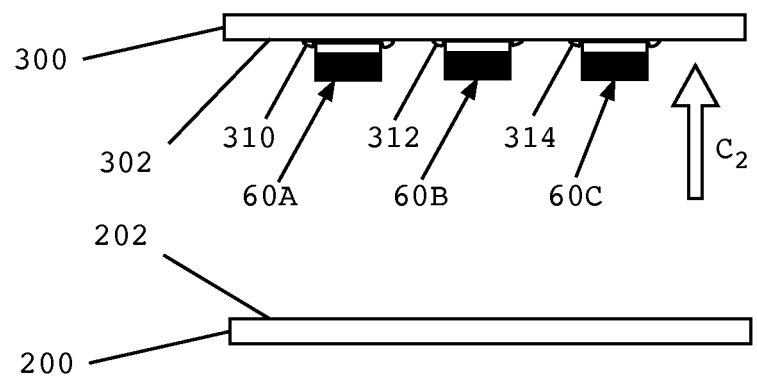

FIGS. 12-14 show side schematic views of the "bottom up" transfer method described above. In FIG. 12, diamagnetic components 60A, 60B, 60C are levitating above surface 102 of diamagnetic stage 100. First substrate 200 is disposed between surface 102 and diamagnetic components 60A, 60B, 60C. A plurality of droplets 210, 212, 214 of a residue-free liquid are disposed along surface 202 of first substrate 200. As noted above, droplets 210, 212, 214 may be arranged on surface 202 to correspond to the positions of diamagnetic components 60A, 60B, 60C above magnetic stage 100.

Diamagnetic components 60A, 60B, 60C are brought into contact with substrate 200 by raising substrate 200 upward in direction U until droplets 210, 212, 214 contact the diamagnetic layers (e.g., 62A) of diamagnetic components 60A, 60B, 60C, at which point the capillary force of droplets 210, 212, 214 adhere diamagnetic components 60A, 60B, 60C to surface 202 of substrate 200.

FIG. 13 shows diamagnetic components 60A, 60B, 60C following transfer to first substrate 200, with second substrate 300 disposed above diamagnetic components 60A, 60B, 60C. A first capillary force $C_1$ adheres diamagnetic components 60A, 60B, 60C to first substrate 200. A plurality of droplets 310, 312, 314 of a residue-free liquid are disposed along surface 302 of second substrate 300. As noted above, droplets 310, 312, 314 may be arranged on surface 302 to correspond to the positions of diamagnetic components 60A, 60B, 60C on first substrate 200.

As will be apparent to one skilled in the art, transferring diamagnetic components 60A, 60B, 60C to second substrate 300 may involve either or both of a lowering of second substrate 300 or a raising of first substrate 200 until diamagnetic components 60A, 60B, 60C contact droplets 310, 312, 314.

FIG. 14 shows first substrate 200 and second substrate 300 following transfer of diamagnetic components 60A, 60B, 60C to surface 302 of second substrate 300. A second capillary force $C_2$ provided by droplets 310, 312, 314 adheres diamagnetic components 60A, 60B, 60C to surface 302.

As noted above, diamagnetic components 60A, 60B, 60C may then be connected to second substrate 300 using, for example, a solder reflow to form a solder connection between second substrate 300 and the non-diamagnetic layers of diamagnetic components 60A, 60B, 60C. According to some embodiments of the invention, the diamagnetic layers of diamagnetic components 60A, 60B, 60C may then be removed by, for example, dissolving the adhesive originally used to bond the diamagnetic layers to the non-diamagnetic layers.

In the "bottom up" transfer method described above—or in any other method that includes transferring diamagnetic components from one substrate to another—it is possible, and in some cases desirable, to employ different residue-free liquids capable of exhibiting capillary forces with different strengths. Employing a liquid with a stronger capillary force on the second substrate, for example, may facilitate the transfer of the diamagnetic components from the first substrate to the second substrate.

In other cases, it may be possible to use the same residue-free liquid on both substrates. Applicant has found that, typically, residue-free liquids (e.g., isopropyl alcohol, methanol, etc.) adhere more strongly to non-diamagentic layers than to diamagnetic layers. In addition, the capillary force exhibited by such liquids diminishes as the liquids dry. As such, the capillary force will be greater at the time of the transfer to the second substrate.

Figure 15:
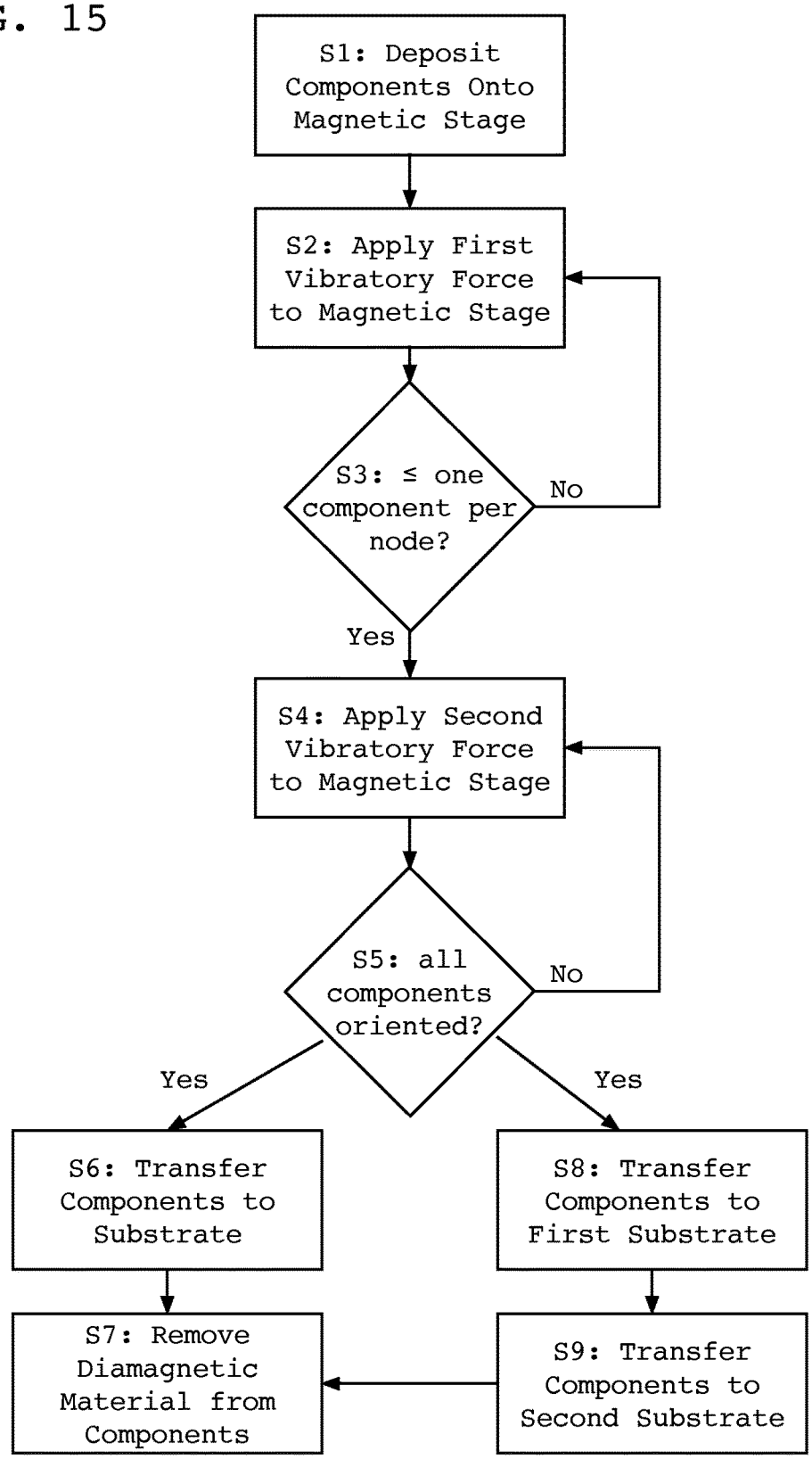
FIG. 15 shows a flow diagram of an illustrative method according to an embodiment of the invention.

FIG. 15 is a flow diagram of illustrative methods according to the invention. At S1, a plurality of diamagnetic components are deposited onto a magnetic stage, as shown, for example, in FIG. 5. At S2, a first vibratory force is applied to the magnetic stage, as described above. At S3, it is determined whether each stable levitation node of the magnetic stage includes no more than one diamagnetic component, as shown, for example, in FIG. 6. If not (i.e., No at S3), steps S2 and S3 may be iteratively looped until no more than one diamagnetic component is included in each stable levitation node.

Once it is determined that no more than one diamagnetic component is included in each stable levitation node (i.e., Yes at S3), a second vibratory force is applied to the magnetic stage to impart a desired vertical orientation to the diamagnetic components, as shown, for example, in FIG. 8. At S5, it is determined whether each of the diamagnetic components remaining in the stable levitation nodes has attained the desired vertical orientation (typically with the non-diamagnetic layer on top). As noted above, in contexts in which a large number of diamagnetic components are employed, it may be impractical to actually determine whether each diamagnetic component has attained the desired vertical orientation. In such cases, this determination may be made based on a statistical likelihood, as described above. If it is determined that all of the remaining diamagnetic components have not (actually or statistically) attained the desired vertical orientation (i.e., No at S5), steps S4 and S5 may be iteratively looped.

Once it is determined that all of the remaining diamagnetic components have (actually or statistically) attained the desired vertical orientation (i.e., Yes at S5), the diamagnetic components may be transferred to a substrate. As described above, this transfer may take the form of a "top down" transfer or a "bottom up" transfer. In the case of the former, for example, the diamagnetic components may be transferred to a substrate at S6 as shown, for example, in FIGS. 10 and 11. Such transfer may include forming solder connections between the substrate and the non-diamagnetic layers of the diamagnetic components, as described above. The diamagnetic layers of the diamagnetic components may then be removed at S7, as described above.

In the case of the latter, "bottom up" transfer, the diamagnetic components may be transferred to a first substrate at S8, as shown, for example, in FIGS. 12 and 13, and then transferred to a second substrate at S9, as shown, for example, in FIG. 14. As noted above, transfer of the diamagnetic components to the second substrate at S9 may include forming solder connections between the second substrate and the non-diamagnetic layers of the diamagnetic components. The diamagnetic layers of the diamagnetic components may then be removed at S7, as described above.

Figure 16:
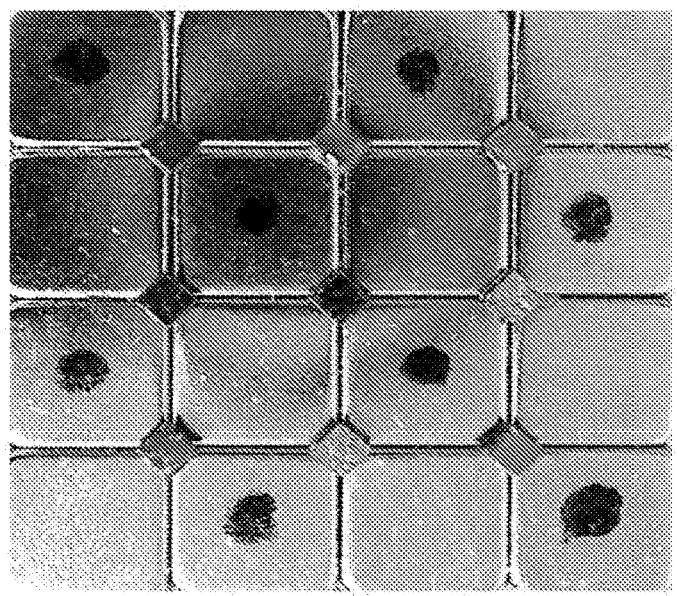
FIGS. 16-18 are photomicrographs of a plurality of diamagnetic components in conjunction with the magnetic stage of FIG. 1.
Figure 17:
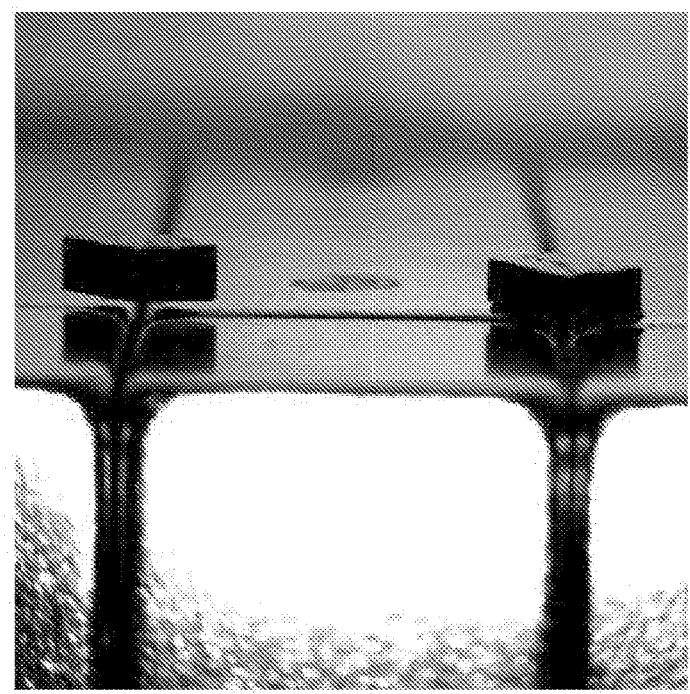
Figure 18:
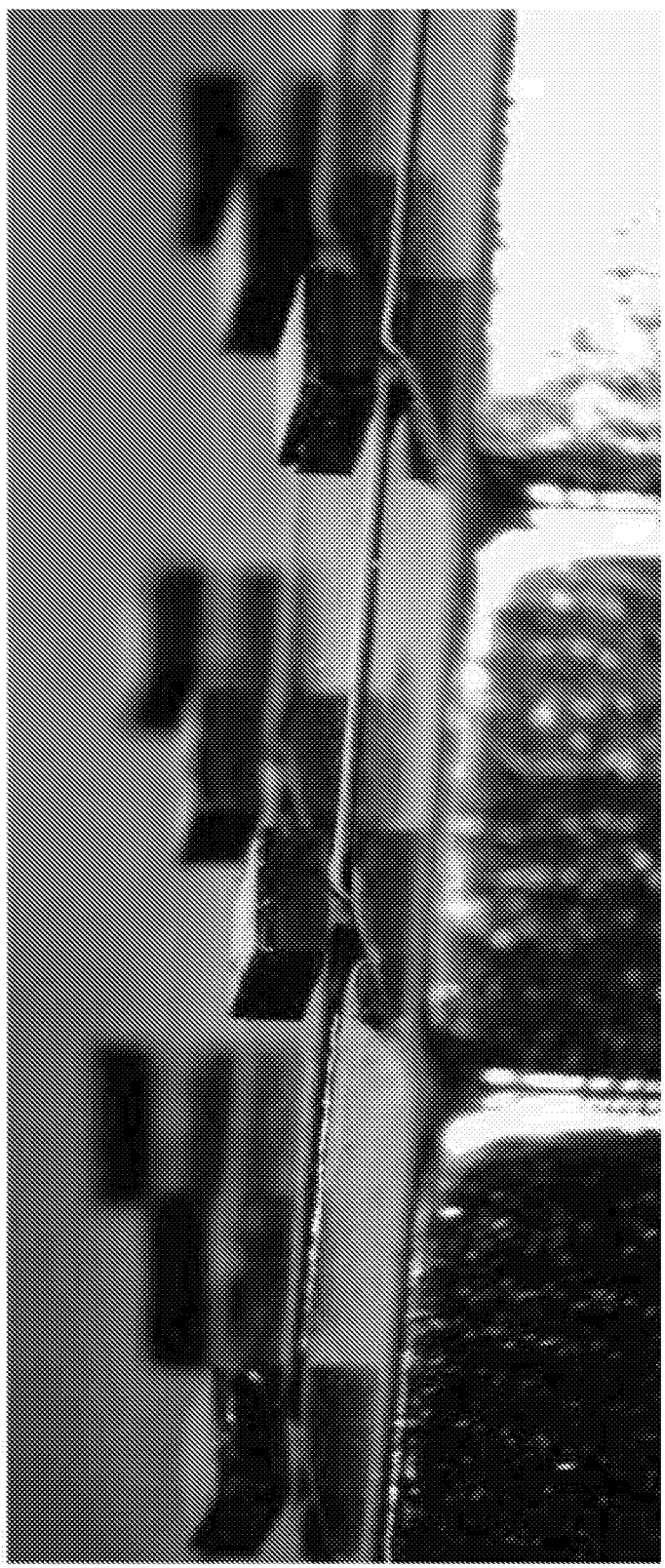

FIGS. 16-18 are photomicrographs of diamagnetic components and magnetic stages at various points in the methods described above. In FIG. 16, a plurality of diamagnetic components have been arranged into stable levitation nodes above a magnetic stage. At this point, the vertical orientation of the diamagnetic components is still random. In each of FIGS. 16-18, the dots on the faces of the magnets making up the magnetic stage represent the north pole of the magnet.

FIG. 17 shows a perspective view of two of the diamagnetic components shown in FIG. 16. The diamagnetic component on the left has a "proper" vertical orientation, with the diamagnetic layer nearer the magnetic stage, and can be seen to levitate above the magnetic stage. The diamagnetic component on the right has an "inverted" vertical orientation, with the non-diamagnetic layer nearer the magnetic stage. As a consequence, the diamagnetic component on the right can be seen to contact or levitate only slightly above the magnetic stage.

FIG. 18 shows a perspective view of the diamagnetic components following the orientation of each of the diamagnetic components to a "proper" vertical orientation. Each of the diamagnetic components can be seen to levitate above the magnetic stage.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any related or incorporated methods described herein. The patentable scope of the invention is defined by the claims and may include other examples, variations, aspects, or embodiments that occur to those skilled in the art. Such other examples, variations, aspects, and embodiments are intended to be within the scope of the claims if they have elements that do not differ from the literal language of the claims or if they include equivalent elements with insubstantial differences from the literal language of the claims.

What is claimed is:

1. A method of assembling a plurality of diamagnetic components, the method comprising:
   depositing a plurality of diamagnetic components onto a magnetic stage, the magnetic stage comprising a plurality of magnets arranged in an array; and
   applying a vibratory force to the magnetic stage,
   wherein, applying the vibratory force moves at least one of the plurality of diamagnetic components to a stable levitation node of the magnetic stage.

2. The method of claim 1, wherein the plurality of magnets are arranged in an array selected from a group consisting of: a checkerboard array with alternating north and south poles and a two-dimensional Halbach array.

3. The method of claim 1, wherein the plurality of magnets includes at least one magnet selected from a group consisting of: neodymium magnets and samarium-cobalt magnets.

4. The method of claim 1, wherein applying the vibratory force includes repeatedly applying the vibratory force.

5. The method of claim 1, wherein applying the vibratory force causes each of the stable levitation nodes to be filled by no more than one diamagnetic component.

6. The method of claim 1, wherein the number of diamagnetic components is greater than the number of stable levitation nodes, such that application of the vibratory force causes a single diamagnetic component to fill each of the stable levitation nodes and any diamagnetic components not filling a stable levitation node to fall off the magnetic stage.

7. The method of claim 1, wherein each of the diamagnetic components includes a layer of non-diamagnetic material atop a layer of diamagnetic material.

8. The method of claim 7, further comprising:
applying an additional vibratory force to the magnetic stage, such that the plurality of diamagnetic components acquire a common vertical orientation.

9. The method of claim 8, wherein the common vertical orientation is defined as the layer of diamagnetic material being disposed between the magnetic stage and the layer of non-diamagnetic material.

10. The method of claim 8, wherein the additional vibratory force includes a series of short vibratory pulses, each series separated by a pause.

11. The method of claim 1, further comprising:
transferring a portion of the plurality of diamagnetic components to a substrate.

12. The method of claim 11, wherein the transferring includes:
applying a substrate to the portion of the plurality of diamagnetic components; and
fixing the substrate to each of the diamagnetic components to which the substrate is applied.

13. The method of claim 1, further comprising:
removing the layer of diamagnetic material from the layer of non-diamagnetic material of each of the diamagnetic components transferred to the substrate.

14. The method of claim 13, wherein the transferring includes:
placing a first substrate between the magnetic stage and the portion of the plurality of diamagnetic components;
transferring the portion of the plurality of diamagnetic components to a surface of the first substrate;
placing a second substrate above the portion of the plurality of diamagnetic components;
transferring the portion of the plurality of diamagnetic components to a surface of the second substrate; and
fixing the portion of the plurality of diamagnetic components to the surface of the second substrate.

15. The method of claim 14, further comprising:
removing the diamagnetic material from the layer of non-diamagnetic material of each of the diamagnetic components transferred to the surface of the second substrate.

16. The method of claim 1, wherein at least one of the plurality of diamagnetic components is selected from a group consisting of: a semiconductor die bonded to a pyrolytic graphite (PG) sheet and a gallium nitride (GaN) light emitting diode (LED) bonded to a PG sheet.

17. The method of claim 16, wherein the PG sheet has a thickness between about 300 micrometers and about 1000 micrometers.

18. The method of claim 17, wherein the PG sheet has a thickness between about 400 micrometers and about 700 micrometers.

19. A system for directed self-assembly of diamagnetic components, the system comprising:
a magnetic stage comprising:
a plurality of magnetic devices arranged in an array with alternating and opposite magnetic orientations; and
a surface disposed above the plurality of magnetic devices; and
at least one device operable to deliver a vibratory force to the magnetic stage,
wherein the vibratory force is sufficient to move a diamagnetic component on the surface of the magnetic stage to a stable levitation node of the magnetic stage.

20. A method of assembling a plurality of diamagnetic components, the method comprising:
depositing a plurality of diamagnetic components onto a magnetic stage, the magnetic stage comprising a plurality of magnets arranged in an array; and
repeatedly applying a vibratory force to the magnetic stage to move at least one of the plurality of diamagnetic components to one of a plurality of stable levitation nodes of the magnetic stage but no more than one diamagnetic component to each of the plurality of stable levitation nodes,
wherein the plurality of magnets are arranged in an array selected from a group consisting of: a checkerboard array with alternating north and south poles and a two-dimensional Halbach array and applying the vibratory force causes each of the stable levitation nodes to be filled by no more than one diamagnetic component.

* * * * *